United States Patent [19]
Wu

[11] Patent Number: 6,001,695
[45] Date of Patent: Dec. 14, 1999

[54] METHOD TO FORM ULTRA-SHORT CHANNEL MOSFET WITH A GATE-SIDE AIRGAP STRUCTURE

[75] Inventor: Shye-Lin Wu, Hsinchu, Taiwan

[73] Assignee: Texas Instruments - Acer Incorporated, Hsinchu, Taiwan

[21] Appl. No.: 09/033,948

[22] Filed: Mar. 2, 1998

[51] Int. Cl.[6] .......................... H01L 21/22; H01L 21/225; H01L 21/38; H01L 21/385

[52] U.S. Cl. .......................... 438/289; 438/305; 438/307; 438/595; 257/340; 257/387; 257/410

[58] Field of Search .................................... 438/595, 303, 438/291, 299, 305, 231, 683, 282, 384, 385, 659; 427/88; 257/359

*Primary Examiner*—Olik Chaudhuri
*Assistant Examiner*—Bernard Souw
*Attorney, Agent, or Firm*—Harness, Dickey & Pierce, P.L.C.

[57] ABSTRACT

First, a field oxide region, a pad oxide layer and a first nitride layer are formed on a silicon substrate, respectively. Then, a portion of the first nitride layer is removed. A first oxide layer and a nitride spacer are formed on the substrate, respectively. Portions of the first oxide layer and the pad oxide layer are removed to form a first region of the first oxide layer and a second region of the first oxide layer. Then, an ion implantation is performed to form a punch-through stopping region. Next, a second oxide layer and an amorphous-Si layer are formed on the substrate, respectively.

Portions of the a-Si layer are etched back. Next, the first nitride layer and the nitride spacer are removed. An ion implantation is performed to form a source, a drain and a doped region at the bottom of the second region of the first oxide layer. Then, a Rapid Thermal Process is used to drive dopant diffusion to form an extended source/drain junction. A third oxide layer is deposited on the substrate, wherein an air-gap is formed between the first region of the first oxide layer and a-Si layer. Finally, portions of the third oxide layer and the pad oxide layer are etched back to form an oxide spacer with the air-gap.

27 Claims, 4 Drawing Sheets

METHOD TO FORM ULTRA-SHORT CHANNEL MOSFET WITH A GATE-SIDE AIRGAP STRUCTURE

FIELD OF THE INVENTION

The present invention relates to an ultra-short channel Metal Oxide Semiconductor Field Effect Transistor (MOSFET), and especially to a method of fabricating ultra-short channel MOSFET with a gate-side air-gap structure.

BACKGROUND OF THE INVENTION

From the birth of the first integrated circuits at 1960, the number of device on a chip has grown in an explosive increasing rate. In recent year, the progress of semiconductor technology has driven the integrated circuits technologies toward Ultra Large Scale Integration (ULSI) level or even higher level. In ULSI, some negative effects result from the higher integration of devices and the smaller scale of devices. Metal Oxide Semiconductor Field Effect Transistor (MOSFET) device is the most important and widely applied devices in the integrated circuits technologies.

To satisfy the requirement for high speed circuit operation and high density of ULSI level, the ultra-short channel Metal Oxide Semiconductor (MOS) device was proposed. One of some articles relates to the ultra-short channel MOS device. Please see "Performance and Reliability Optimization of Ultra Short Channel CMOS Device for Giga-bit DRAM Applications, 1995, IEEE, IEDM 95–435". However, it is difficult to define the gate length to be below 0.1 $\mu$m due to the limitation of current optical lithography. One of some articles relates to the above problems. Please see "SUB-50 NM GATE LENGTH N-MOSFETS WITH 10 NM PHOSPHORUS SOURCE AND DRAIN JUNCTIONS, 1993, IEEE, IEDM 93–119".

For realizing high speed and low power ULSI devices, the conventional Complementary Metal Oxide Semiconductor (CMOS) device has been designed with thin gate oxide and short channel length. But the technology of fabricating CMOS devices will increase the gate to drain capacitance. Because the parasitic capacitance is consisted of the gate capacitance, the gate to drain capacitance, the junction capacitance and the gate fringing capacitance, the increasing gate to drain capacitance will augment the parasitic capacitance. So, minimizing the gate to drain capacitance is another key issue for realizing high speed and low power ULSI devices. One of some articles relates to the above problems. Please see "Impact of Reduction of the Gate to Drain Capacitance on Low Voltage Operated CMOS Devices, 1995 Symposium on VLSI Technology Digest of Technical Papers". The above article proposes a new Transistor-gate (T-gate) CMOS device with dual gate structure using amorphous-Si/Polysilicon layer in order to reduce the gate to drain capacitance without the transconductance degradation.

The gate fringing field capacitance (CFR) becomes more important as the gate length is reduced to deep sub-$\mu$m. One of some articles relates to the above problems. Please see "A Gate-side Air-gap Structure (GAS) to Reduce the Parasitic Capacitance in MOSFETs , 1996 Symposium on VLSI Technology Digest of Technical Papers".

So, solving above problems is required.

SUMMARY OF THE INVENTION

According to one embodiment of the present invention, a field oxide region is grown on a silicon substrate to provide isolation between devices on the substrate. A pad oxide layer and a first nitride layer are formed on the silicon substrate, respectively.

Then, a portion of the first nitride layer is removed to define a gate region of a transistor. Next, a first oxide layer is formed on the pad oxide layer and the first nitride layer. Then, a second nitride layer is deposited on the first oxide layer. Subsequently, portions of the second nitride layer are removed by etching back process to form a nitride spacer. Portions of the first oxide layer and the pad oxide layer are etched back to form a first region of the first oxide layer abutting to the nitride spacer and between the first nitride layer and the nitride spacer and form a second region of the first oxide layer under the nitride spacer and aligned with the nitride spacer. Then, an ion implantation is performed using the nitride spacer, the first region of the first oxide layer, the second region of the first oxide layer and the nitride spacer as a mask to form a punch-through stopping region in the silicon substrate. Next, a second oxide layer is formed on the silicon substrate and abutting to the pad oxide layer. Then, an amorphous-Si (a-Si) layer is formed on the silicon substrate.

Then, portions of the a-Si layer are etched back until the first nitride layer is exposed. Next, the first nitride layer and the nitride spacer are removed. Subsequently, an ion implantation is performed using the field oxide region, the first region of the first oxide layer and the a-Si layer as a mask to form a source, a drain and a doped region at the bottom of the second region of the first oxide layer. Then, a Rapid Thermal Process (RTP) annealing is used to drive dopant diffusion to form an extended source/drain junction. Next, a third oxide layer is deposited on the silicon substrate. Because of "step coverage effect", an air-gap will produce between the a-Si layer and the first region of the first oxide layer. Finally, portions of the third oxide layer and the pad oxide layer are etched back to form an oxide spacer with the air-gap, wherein the oxide spacer is located on the silicon substrate and the a-Si layer.

DETAILED DESCRIPTION OF THE PREFERRED EMBODIMENT

The present invention discloses a method of fabricating ultra-short channel Metal Oxide Semiconductor Field Effect Transistor (MOSFET) with a gate-side air-gap structure. The more detailed description of the present invention will be seen as follows.

Figure 1:
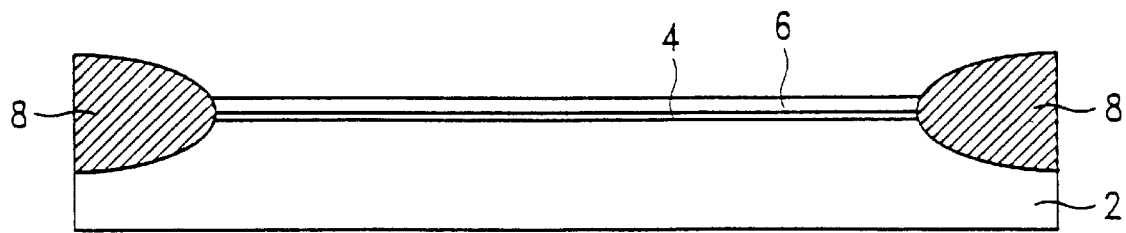
FIG. 1 is a cross-sectional view of forming a silicon dioxide layer, a silicon nitride layer and a field oxide region on a silicon substrate in accordance with the present invention.

Referring to FIG. 1, a single crystal silicon substrate 2 with a <100> crystallographic orientation is provided. A silicon dioxide layer 4 is grown on the silicon substrate 2 by using thermal oxidation step. Then, a silicon nitride layer 6 is formed on the silicon dioxide layer 4 by using low pressure chemical vapor deposition (LPCVD). Portions of the silicon nitride layer 6 are removed. Then, a field oxide region 8 is grown on the silicon substrate 2 via lithography and etching steps to etch a silicon nitride-silicon dioxide composition layer by thermal oxidation process. The goal of the field oxide region 8 is providing isolation between devices on the substrate 2.

Figure 2:
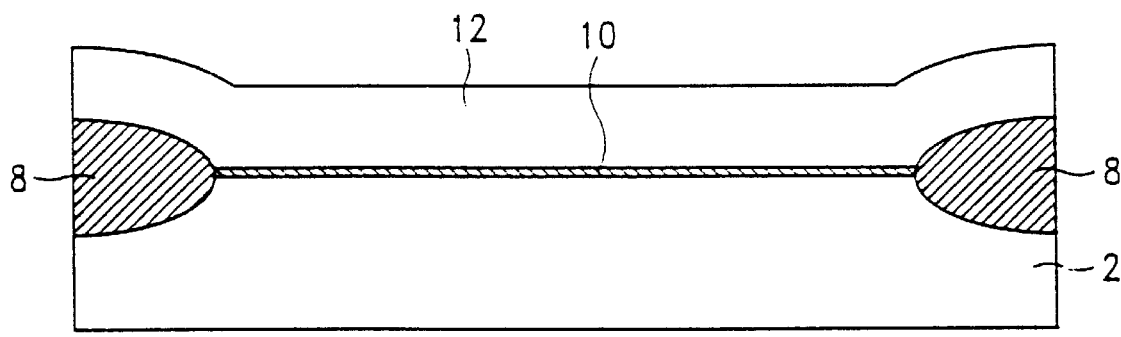
FIG. 2 is a cross-sectional view of forming a pad oxide layer and a first nitride layer on a silicon substrate in accordance with the present invention.
Figure 3:
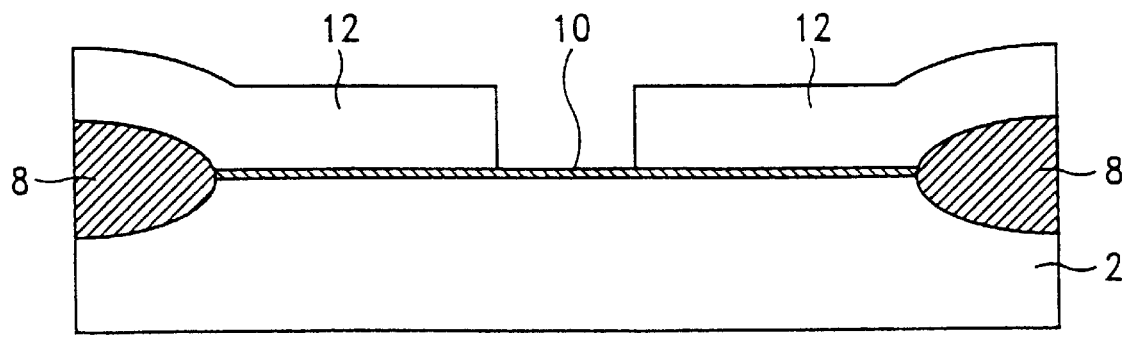
FIG. 3 is a cross-sectional view of removing a portion of the first nitride layer to define a gate region of a transistor in accordance with the present invention.

Referring to FIG. 2, the silicon dioxide layer 4 and the silicon nitride layer 6 are removed via etching step. Then, a pad oxide layer 10 is grown on the silicon substrate 2 by using thermal oxidation process or chemical vapor deposition process. Subsequently, a first nitride layer 12 is deposited on the field oxide region 8 and the pad oxide layer 10. Referring to FIG. 3, a portion of the first nitride layer 12 is removed via lithography and etching steps to define a gate region of a transistor. In one embodiment of the present invention, the temperature of thermal oxidation process is about 750~1150° C., the thickness of the pad oxide layer 10 is about 50~500 angstroms. The thickness of the first nitride layer 12 is about 500~5000 angstroms. And the first nitride layer 12 is deposited by LPCVD or plasma enhanced chemical vapor deposition (PECVD) systems.

Figure 4:
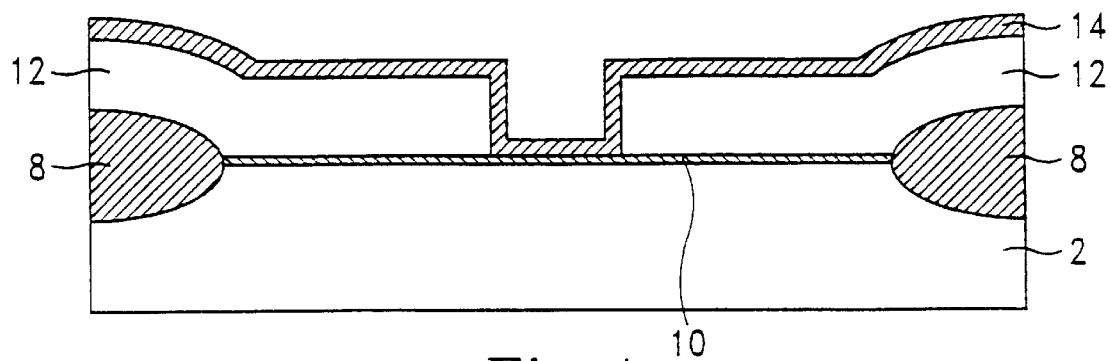
FIG. 4 is a cross-sectional view of depositing a first oxide layer on the pad oxide layer and the first nitride layer in accordance with the present invention.
Figure 5:
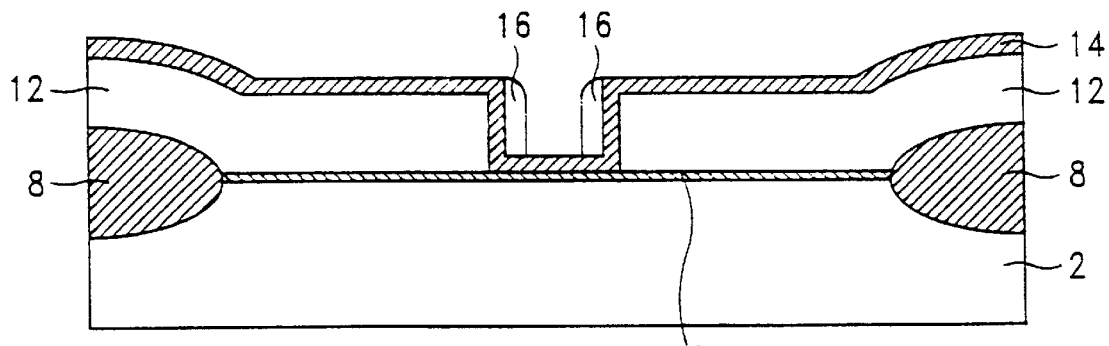
FIG. 5 is a cross-sectional view of forming a second nitride layer on the first oxide layer and then etching back portions of the second nitride layer to form a nitride spacer in accordance with the present invention.

Turning to FIG. 4, a first oxide layer 14 is deposited on the pad oxide layer 10 and the first nitride layer 12 via LPCVD or PECVD systems. Referring to FIG. 5, a second nitride layer 16 is formed on the first oxide layer 14 by using LPCVD or PECVD systems. Then, portions of the second nitride layer 16 are removed by etching back process until the first oxide layer 14 is exposed to form a nitride spacer 16. In one embodiment of the present invention, the thickness of the first oxide layer 14 is about 100~1000 angstroms and the thickness of the second nitride layer 16 is about 100~1000 angstroms.

Figure 6:
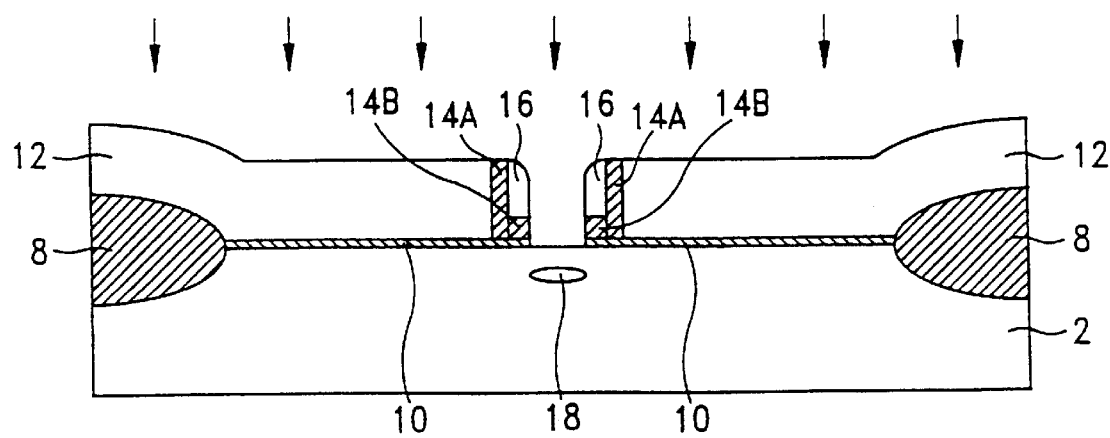
FIG. 6 is a cross-sectional view of forming a first region of the first oxide layer and a second region of the first oxide layer by etching back portions of the first oxide layer and then performing an ion implantation to form a punch-through stopping region in accordance with the present invention.

Referring to FIG. 6, portions of the first oxide layer 14 are etched back using the nitride spacer 16 as a mask to form a first region 14A of the first oxide layer 14 abutting to the nitride spacer 16 and between the first nitride spacer 12 and the nitride spacer 16 and form a second region 14B of the first oxide layer 14 under the nitride spacer 16 and aligned with the nitride spacer 16. Then, an ion implantation is performed using the first nitride spacer 16, the first region 14A of the first oxide layer 14, the second region 14B of the first oxide layer 14 and the nitride spacer 16 as a mask to form a punch-through stopping region 18 in the silicon substrate 2. In one embodiment of the present invention, the energy of ion implantation is about 0.5~100 KeV and the dosage of ion implantation is about $10^{11}$~$5*10^{13}$cm$^{-2}$.

Figure 7:
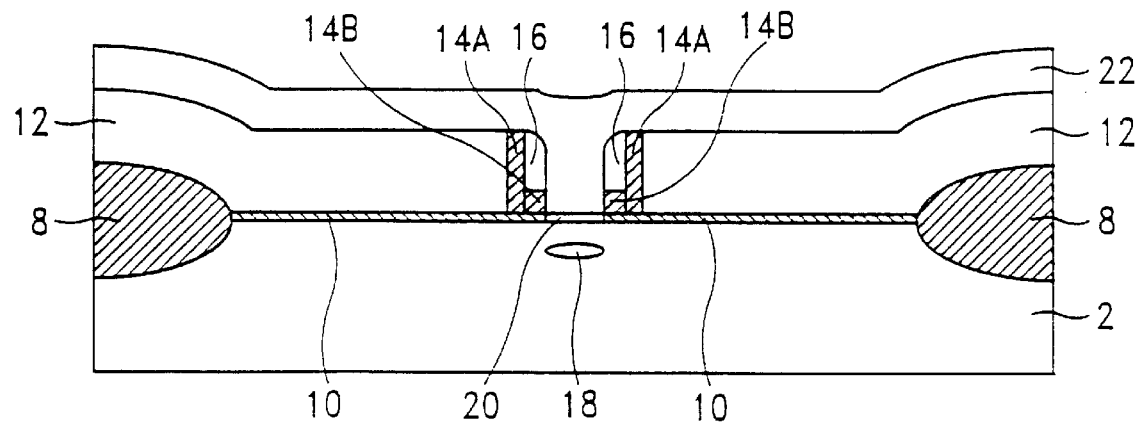
FIG. 7 is a cross-sectional view of growing a second oxide layer and depositing an amorphous-Si (a-Si) layer on the silicon substrate in accordance with the present invention.

Turning to FIG. 7, a second oxide layer 20 is grown on the silicon substrate 2 and abutting to the pad oxide layer 10 by using thermal oxidation process in the $N_2O$ or NO ambient. The second oxide layer 20 is used as the gate oxide. Then, an amorphous-Si (a-Si) layer 22 is deposited on the silicon substrate 2. In one embodiment of the present invention, the temperature of thermal oxidation process is about 700~1150° C. The thickness of the second oxide layer 20 is about 15~200 angstroms and the thickness of the a-Si layer 22 is about 300~2000 angstroms. The a-Si layer is deposited by using LPCVD, PECVD, electron cyclotron response chemical vapor deposition(ECRCVD) or ultra high vacuum chemical vapor deposition(UHVCVD) systems.

Figure 8:
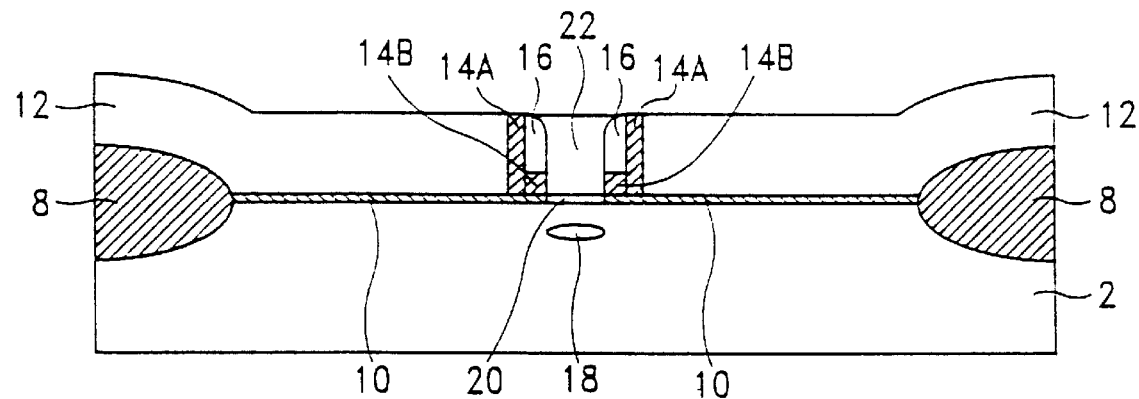
FIG. 8 is a cross-sectional view of etching back the a-Si layer by Reactive Ion Etching (RIE) or Chemical Mechanical Polishing (CMP) system in accordance with the present invention.
Figure 9:
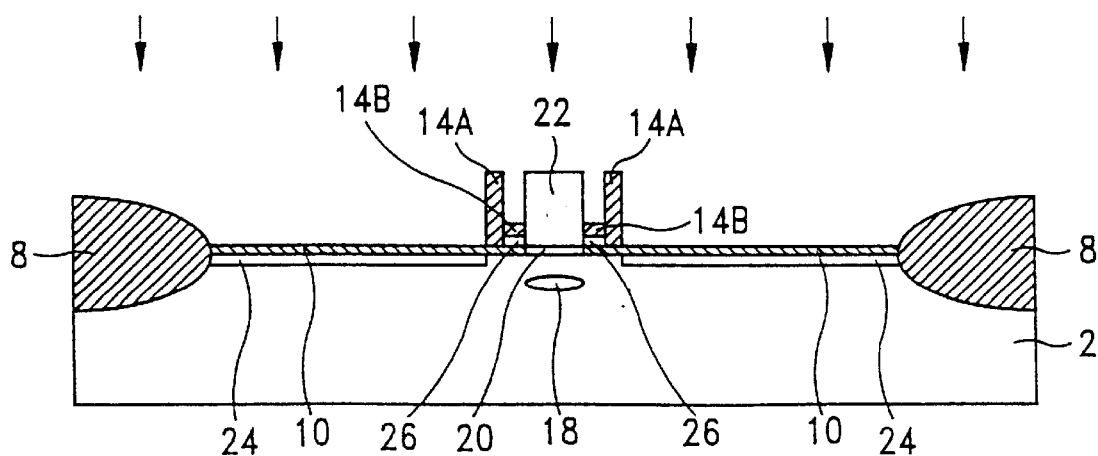
FIG. 9 is a cross-sectional view of removing the nitride spacer and the first nitride layer and then performing an ion implantation to form a source, a drain and a doped region at the bottom of the second region of the first oxide layer in accordance with the present invention.

Referring to FIG. 8, portions of the a-Si layer 22 is etched back until the first nitride layer 12 is exposed by Reactive Ion Etching (RIE) or Chemical Mechanical Polishing (CMP) systems. Referring to FIG. 9, the first nitride layer 12 and the nitride spacer 16 are removed via lithography and etching steps. Next, an ion implantation is performed using the field oxide region 8, the first region 14A of the first oxide layer 14 and the a-Si layer 22 as a mask to form a source 24, a drain 24 and a doped region 26 at the bottom of the second region 14B of the first oxide layer 14. In one embodiment of the present invention, the energy of ion implantation is about 0.5~50 KeV and the dosage of ion implantation is about $5*10^{14}$~$5*10^{16}$cm$^{-2}$.

Figure 10:
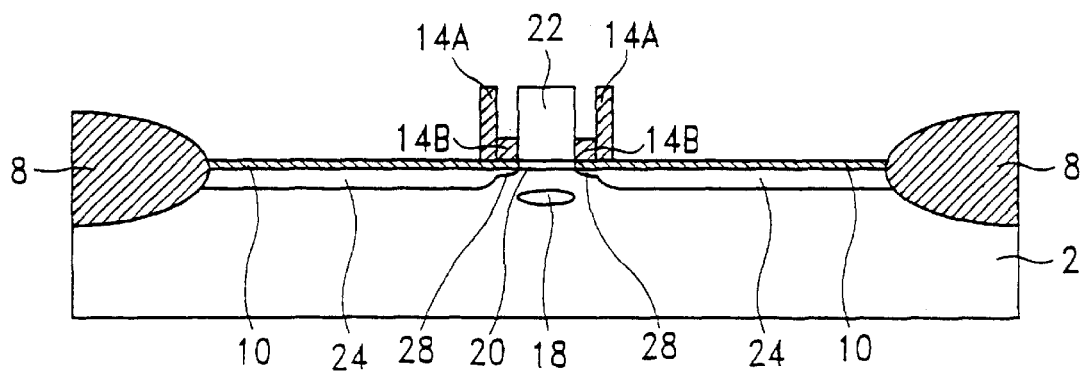
FIG. 10 is a cross-sectional view of driving dopant diffusion to form an extended source/drain junction by using a Rapid Thermal Process (RTP) annealing in accordance with the present invention.
Figure 11:
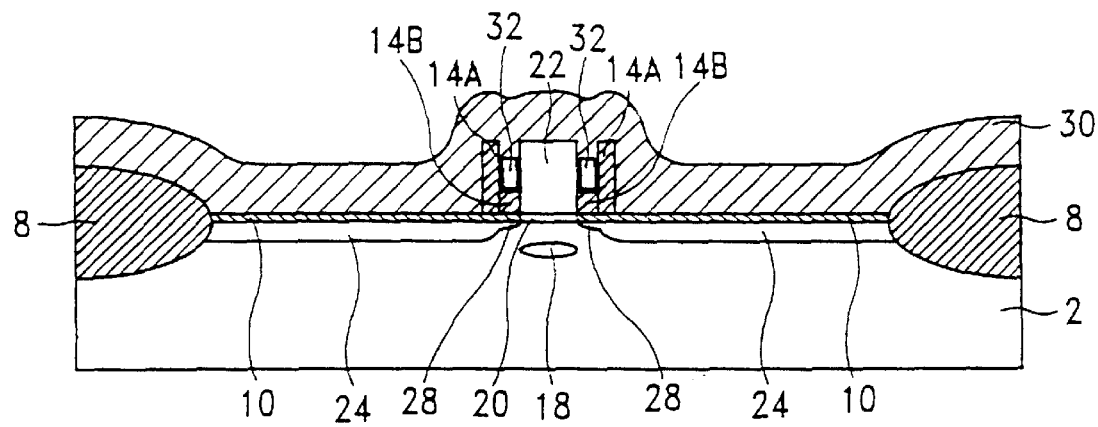
FIG. 11 is a cross-sectional view of depositing a third oxide layer on the silicon substrate, wherein an air-gap is formed between the first region of the first oxide layer and the a-Si layer in accordance with the present invention.
Figure 12:
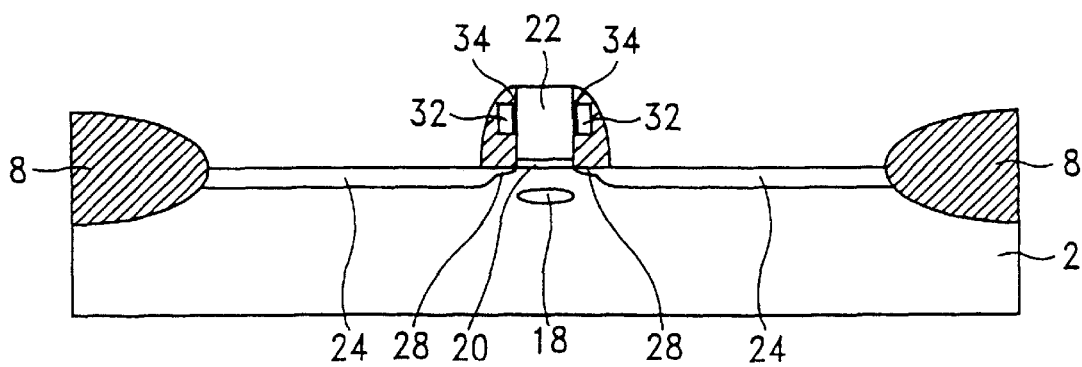
FIG. 12 is a cross-sectional view of removing portions of the third oxide layer and the pad oxide layer by etching back to form an oxide spacer with the air-gap, wherein the oxide spacer is located on the silicon substrate and abutting to the a-Si layer in accordance with the present invention.

Turning to FIG. 10, a Rapid Thermal Process (RTP) annealing is used to drive dopant diffusion to form an extended source/drain junction 28. In one embodiment of the present invention, the temperature of the RTP annealing is about 750~1150° C. and the time of RTP annealing is about 5~180 seconds. Referring to FIG. 11, a third oxide layer 30 is deposited on the silicon substrate 2. Because of "step coverage effect", an air-gap 32 will produce between the a-Si layer 22 and the first region 14A of the first oxide layer 14. Referring to FIG. 12, portions of the third oxide layer 30 and the pad oxide layer 10 are etched back to form an oxide spacer 34 with the air-gap 34, wherein the oxide spacer 34 is located on the silicon substrate 2 and abutting to the a-Si layer 22. In one embodiment of the present invention, the third oxide layer 30 is deposited by LPCVD or PECVD systems. The thickness of the third oxide layer 30 is about 1000~3000 angstroms.

The benefits of the present invention are forming an ultra-short channel MOS device by using the current lithography technology and reducing the parasitic fringing field capacitance by using a gate-side air-gap structure.

As will be understood by a person skilled in the art, the foregoing preferred embodiment of the present invention is illustrated of the present invention rather than limiting of the present invention. Although the preferred embodiment of the invention has been illustrated and described, it will be obvious to those skilled in the art that various changes can be made therein without departing from the spirit which is intended to be limited solely by the appended claims.

I claim:

1. A method of fabricating transistor on a silicon substrate, said method comprising the steps of:

forming a field oxide region on said silicon substrate;

forming a pad oxide layer on said silicon substrate;

forming a first nitride layer on said pad oxide layer and said field oxide layer;

removing a portion of said first nitride layer via lithography and etching step to define a gate region of a transistor;

forming a first oxide layer on said first nitride layer and said pad oxide layer;

forming a second nitride layer on said first oxide layer;

etching back portions of said second nitride layer until said first oxide layer is exposed to form a nitride spacer;

removing portions of said first oxide layer and said pad oxide layer using said nitride spacer as a mask to form a first region of said first oxide layer abutting to said nitride spacer and between said first nitride layer and said nitride spacer and form a second region of said first oxide layer under said nitride spacer and aligned with said nitride spacer;

performing an ion implantation using said first nitride layer, said first region of said first oxide layer, said second region of said first oxide layer and said nitride spacer as a mask to form a punch-through stopping region in the silicon substrate;

forming a second oxide layer on said silicon substrate and abutting to said pad oxide layer;

forming an amorphous-Si (a-Si) layer on said silicon substrate;

etching back portions of said a-Si layer until said first nitride layer is exposed;

removing said first nitride layer and said nitride spacer via lithography and etching processes;

performing an ion implantation using said field oxide region, said first region of said first oxide layer and said a-Si layer as a mask to form a source, a drain and a doped region at the bottom of said second region of said first oxide layer;

driving dopant diffusion to form an extended source/drain junction;

forming a third oxide layer on said silicon substrate, wherein an air-gap is formed between said first region of said first oxide layer and said a-Si layer; and removing portions of said third oxide layer and said pad oxide layer via etching back to form an oxide spacer with said air-gap, wherein said oxide spacer is located on said silicon substrate and abutting to said a-Si layer.

2. The method of claim 1, wherein said pad oxide layer is formed by using thermal oxidation process or chemical vapor deposition process.

3. The method of claim 2, wherein the temperature of said thermal oxidation process is about 750~1150° C.

4. The method of claim 1, wherein said first nitride layer is formed by low pressure chemical vapor deposition (LPCVD) or plasma enhanced pressure chemical vapor deposition (PECVD) systems.

5. The method of claim 1, wherein said first oxide layer is formed by LPCVD or PECVD systems.

6. The method of claim 1, wherein said second nitride layer is formed by LPCVD or PECVD systems.

7. The method of claim 1, wherein portions of said first oxide layer and said pad oxide layer are removed by etching back process.

8. The method of claim 1, wherein said second oxide layer is formed by using thermal oxidation process in the $N_2O$ ambient.

9. The method of claim 8, wherein the temperature of said thermal oxidation process is about 750~1150° C.

10. The method of claim 1, wherein said second oxide layer is formed by using thermal oxidation process in the NO ambient.

11. The method of claim 10, wherein the temperature of said thermal oxidation process is about 750~1150° C.

12. The method of claim 1, wherein a-Si layer is formed by LPCVD, PECVD, electron cyclotron response chemical vapor deposition(ECRCVD) or ultra high vacuum chemical vapor deposition (UHVCVD) systems.

13. The method of claim 1, wherein portions of said a-Si layer are etched back with Reactive Ion Etching (RIE) system.

14. The method of claim 1, wherein portions of said a-Si layer are etched back with Chemical Mechanical Polishing (CMP) system.

15. The method of claim 1, wherein said driving dopant diffusion to form an extended source/drain junction is using Rapid Thermal Process (RTP) annealing process.

16. The method of claim 15, wherein the temperature of said Rapid Thermal Process (RTP) annealing is about 750~1150° C.

17. The method of claim 16, wherein the time of said Rapid Thermal Process (RTP) annealing is about 5~180 seconds.

18. The method of claim 1, wherein said third oxide layer is formed by LPCVD or PECVD systems.

19. A method of fabricating transistor on a silicon substrate, said method comprising the steps of:

forming a field oxide region on said silicon substrate;

growing a pad oxide layer on said silicon substrate by using thermal oxidation process or chemical vapor deposition process;

forming a first nitride layer on said pad oxide layer and said field oxide layer;

removing a portion of said first nitride layer via lithography and etching step to define a gate region of a transistor;

forming a first oxide layer on said first nitride layer and said pad oxide layer;

forming a second nitride layer on said first oxide layer;

etching back portions of said second nitride layer until said first oxide layer is exposed to form a nitride spacer;

removing portions of said first oxide layer and said pad oxide layer using said nitride spacer as a mask by etching back process to form a first region of said first oxide layer abutting to said nitride spacer and between said first nitride layer and said nitride spacer and form a second region of said first oxide layer under said nitride spacer and aligned with said nitride spacer;

performing an ion implantation using said first nitride layer, said first region of said first oxide layer, said second region of said first oxide layer and said nitride spacer as a mask to form a punch-through stopping region in the silicon substrate;

growing a second oxide layer on said silicon substrate and abutting to said pad oxide layer by using thermal oxidation process in the $N_2O$ or NO ambient;

forming an amorphous-Si (a-Si) layer on said silicon substrate;

etching back portions of said a-Si layer until said first nitride layer is exposed with Reactive Ion Etching (RIE) and Chemical Mechanical Polishing (CMP) systems;

removing said first nitride layer and said nitride spacer via lithography and etching processes;

performing an ion implantation using said field oxide region, said first region of said first oxide layer and said a-Si layer as a mask to form a source, a drain and a doped region at the bottom of said second region of said first oxide layer;

driving dopant diffusion to form an extended source/drain junction by Rapid Thermal Process (RTP);

forming a third oxide layer on said silicon substrate, wherein an air-gap is formed between said first region of said first oxide layer and said a-Si layer; and removing portions of said third oxide layer and said pad oxide layer via etching back to form an oxide spacer with said air-gap, wherein said oxide spacer is located on said silicon substrate and abutting to said a-Si layer.

20. The method of claim 19, wherein the temperature of said thermal oxidation process is about 750~1150° C.

21. The method of claim 19, wherein said first nitride layer is formed by low pressure chemical vapor deposition (LPCVD) or plasma enhanced pressure chemical vapor deposition (PECVD) systems.

22. The method of claim 19, wherein said first oxide layer is formed by LPCVD or PECVD systems.

23. The method of claim 19, wherein said second nitride layer is formed by LPCVD or PECVD systems.

24. The method of claim 19, wherein a-Si layer is formed by LPCVD, PECVD, ECRCVD or UHVCVD systems.

25. The method of claim 19, wherein the temperature of said Rapid Thermal Process (RTP) annealing is about 750~1150° C.

26. The method of claim 19, wherein the time of said Rapid Thermal Process (RTP) annealing is about 5~180 seconds.

27. The method of claim 19, wherein said third oxide layer is formed by LPCVD or PECVD systems.

* * * * *